(12) United States Patent
Herslow

(10) Patent No.: US 11,367,693 B2
(45) Date of Patent: Jun. 21, 2022

(54) FOIL COMPOSITE CARD

(71) Applicant: CompoSecure, LLC, Somerset, NJ (US)

(72) Inventor: John Herslow, Bridgewater, NJ (US)

(73) Assignee: CompoSecure, LLC, Somerset, NJ (US)

( * ) Notice: Subject to any disclaimer, the term of this patent is extended or adjusted under 35 U.S.C. 154(b) by 0 days.

(21) Appl. No.: 16/452,740

(22) Filed: Jun. 26, 2019

(65) Prior Publication Data

US 2019/0378805 A1    Dec. 12, 2019

Related U.S. Application Data

(60) Division of application No. 14/183,868, filed on Feb. 19, 2014, now Pat. No. 10,373,920, which is a
(Continued)

(51) Int. Cl.
*H01L 23/00*  (2006.01)
*B32B 37/12*  (2006.01)
(Continued)

(52) U.S. Cl.
CPC .............. *H01L 23/57* (2013.01); *B32B 7/12* (2013.01); *B32B 15/04* (2013.01); *B32B 37/12* (2013.01);
(Continued)

(58) Field of Classification Search
CPC .......... B32B 7/12; B32B 15/04; B32B 37/12; B32B 38/06; B42D 25/328; B42D 25/373;
(Continued)

(56) References Cited

U.S. PATENT DOCUMENTS 4,202,811 A    5/1980    Michael et al.
4,354,851 A    10/1982    Hix et al.
(Continued)

FOREIGN PATENT DOCUMENTS

CN    1172141 A    2/1998
EP    0368570 A2    5/1990
(Continued)

OTHER PUBLICATIONS

Communication Pursuant to Rules 70(2) and 70a(2)EPC for European Application No. 14752098.5, dated Feb. 21, 2017, 1 page.
(Continued)

*Primary Examiner* — Christopher M Polley
*Assistant Examiner* — Sathavaram I Reddy
(74) *Attorney, Agent, or Firm* — RatnerPrestia

(57) ABSTRACT

Composite cards formed include a security layer comprising a hologram or diffraction grating formed at, or in, the center, or core layer, of the card. The hologram may be formed by embossing a designated area of the core layer with a diffraction pattern and depositing a thin layer of metal on the embossed layer. Additional layers may be selectively and symmetrically attached to the top and bottom surfaces of the core layer. A laser may be used to remove selected portions of the metal formed on the embossed layer, at selected stages of forming the card, to impart a selected pattern or information to the holographic region. The cards may be 'lasered' when the cards being processed are attached to, and part of, a large sheet of material, whereby the "lasering" of all the cards on the sheet can be done at the same time and relatively inexpensively.

15 Claims, 15 Drawing Sheets

Related U.S. Application Data continuation of application No. 12/006,168, filed on Dec. 31, 2007, now Pat. No. 9,542,635.

(51) Int. Cl.

| | |
|---|---|
| *B32B 38/06* | (2006.01) |
| *B42D 25/41* | (2014.01) |
| *B42D 25/328* | (2014.01) |
| *G06K 19/077* | (2006.01) |
| *H01L 21/56* | (2006.01) |
| *B42D 25/425* | (2014.01) |
| *B42D 25/435* | (2014.01) |
| *B32B 7/12* | (2006.01) |
| *B32B 15/04* | (2006.01) |
| *G06K 19/06* | (2006.01) |
| *H01L 23/498* | (2006.01) |
| *B42D 25/373* | (2014.01) |
| *B42D 25/47* | (2014.01) |
| *B32B 38/10* | (2006.01) |
| *B32B 38/00* | (2006.01) |

(52) U.S. Cl.
CPC ............ *B32B 38/06* (2013.01); *B42D 25/328* (2014.10); *B42D 25/373* (2014.10); *B42D 25/41* (2014.10); *B42D 25/425* (2014.10); *B42D 25/435* (2014.10); *B42D 25/47* (2014.10); *G06K 19/06065* (2013.01); *G06K 19/0775* (2013.01); *G06K 19/07749* (2013.01); *H01L 21/561* (2013.01); *H01L 23/4985* (2013.01); *H01L 23/49855* (2013.01); *B32B 38/10* (2013.01); *B32B 2038/0092* (2013.01); *B32B 2310/0843* (2013.01); *B32B 2367/00* (2013.01); *B32B 2425/00* (2013.01); *B32B 2429/00* (2013.01); *H01L 2924/0002* (2013.01)

(58) Field of Classification Search
CPC ...... B42D 25/41; B42D 25/425; B42D 25/47; G06K 19/06065; G06K 19/07749; G06K 19/0775; H01L 21/561; H01L 23/4985; H01L 23/49855; H01L 23/57
See application file for complete search history.

(56) References Cited

U.S. PATENT DOCUMENTS

| | | |
|---|---|---|
| 4,469,725 A | 9/1984 | Fischer et al. |
| 4,579,754 A | 4/1986 | Maurer et al. |
| 4,856,857 A | 8/1989 | Takeuchi et al. |
| 4,994,659 A | 2/1991 | Yabe et al. |
| 5,292,616 A | 3/1994 | Fujita et al. |
| 5,316,791 A | 5/1994 | Farber et al. |
| 5,492,370 A | 2/1996 | Chatwin et al. |
| 5,895,909 A | 4/1999 | Yoshida |
| 6,066,437 A | 5/2000 | Kösslinger |
| 6,254,951 B1 | 7/2001 | Marmalich |
| 6,589,642 B1 | 7/2003 | Miller et al. |
| 6,644,552 B1 | 11/2003 | Herslow |
| 6,857,569 B1 | 2/2005 | Smith et al. |
| 7,063,924 B2 | 6/2006 | Kaminsky et al. |
| 7,287,704 B2 | 10/2007 | Herslow |
| 7,503,503 B2 | 3/2009 | Riedl et al. |
| 8,397,998 B1 | 3/2013 | Mann et al. |
| 8,672,232 B2 | 3/2014 | Herslow |
| 8,725,589 B1 | 5/2014 | Skelding et al. |
| 8,755,121 B2 | 6/2014 | Cape et al. |
| 8,944,810 B2 | 2/2015 | Herslow |
| 9,016,591 B2 | 4/2015 | Herslow et al. |
| 9,390,363 B1 | 7/2016 | Herslow et al. |
| 9,390,366 B1 | 7/2016 | Herslow et al. |
| 9,422,435 B2 | 8/2016 | Posey |
| 9,542,635 B2 | 1/2017 | Herslow |
| 9,569,718 B2 | 2/2017 | Herslow |
| 2001/0049004 A1 | 12/2001 | Wilkie |
| 2002/0014297 A1 | 2/2002 | Mott et al. |
| 2002/0015897 A1 | 2/2002 | Toshine et al. |
| 2003/0038174 A1 | 2/2003 | Jones |
| 2003/0107709 A1 | 6/2003 | Rodick |
| 2003/0136848 A1 | 7/2003 | Kiekhaefer |
| 2003/0234286 A1 | 12/2003 | Labrec et al. |
| 2004/0029030 A1 | 2/2004 | Murray |
| 2004/0031855 A1 | 2/2004 | Takahashi |
| 2004/0131756 A1 | 7/2004 | Skierski et al. |
| 2004/0217178 A1 | 11/2004 | Lasch et al. |
| 2004/0218273 A1 | 11/2004 | Mimura |
| 2005/0045729 A1 | 3/2005 | Yamazaki |
| 2005/0189066 A1 | 9/2005 | Look et al. |
| 2005/0252604 A1 | 11/2005 | Smulson |
| 2006/0169785 A1 | 8/2006 | Jones |
| 2006/0172136 A1 | 8/2006 | Komori et al. |
| 2006/0292946 A1 | 12/2006 | Kiekhaefer |
| 2007/0089831 A1 | 4/2007 | Florentino et al. |
| 2008/0152797 A1 | 6/2008 | Biondi et al. |
| 2008/0164307 A1 | 7/2008 | Silverstein |
| 2008/0213551 A1 | 9/2008 | Funicelli et al. |
| 2009/0169776 A1 | 7/2009 | Herslow |
| 2009/0208766 A1 | 8/2009 | Suzuki et al. |
| 2009/0213149 A1 | 8/2009 | Barton et al. |
| 2009/0218401 A1 | 9/2009 | Moran et al. |
| 2009/0315316 A1 | 12/2009 | Staub et al. |
| 2009/0315320 A1 | 12/2009 | Finn |
| 2010/0059266 A1 | 3/2010 | Yoo et al. |
| 2010/0068395 A1 | 3/2010 | Moriya et al. |
| 2010/0230154 A1 | 9/2010 | Naito et al. |
| 2011/0020606 A1 | 1/2011 | Herslow et al. |
| 2011/0031319 A1 | 2/2011 | Kiekhaefer et al. |
| 2011/0079344 A1 | 4/2011 | Sheu |
| 2012/0055998 A1 | 3/2012 | Mieslinger |
| 2012/0208030 A1 | 8/2012 | Audenaert |
| 2012/0270019 A1 | 10/2012 | Wachter et al. |
| 2012/0325914 A1 | 12/2012 | Herslow |
| 2012/0328875 A1 | 12/2012 | Schoneveld et al. |
| 2013/0067842 A1 | 3/2013 | Meersseman et al. |
| 2013/0075477 A1 | 3/2013 | Finn et al. |
| 2013/0248607 A1 | 9/2013 | Zlotnik |
| 2013/0287267 A1 | 10/2013 | Varone |
| 2014/0224881 A1 | 8/2014 | Herslow |
| 2015/0115039 A1 | 4/2015 | Mosteller |
| 2015/0136856 A1 | 5/2015 | Herslow et al. |
| 2015/0180229 A1 | 6/2015 | Herslow |
| 2015/0206047 A1 | 7/2015 | Herslow et al. |
| 2015/0236235 A1 | 8/2015 | Ladizinsky et al. |
| 2015/0298429 A1 | 10/2015 | Ricketts et al. |
| 2015/0339564 A1 | 11/2015 | Herslow et al. |
| 2016/0180212 A1 | 6/2016 | Herslow et al. |
| 2016/0357062 A1 | 12/2016 | Li |
| 2017/0017871 A1 | 1/2017 | Finn et al. |
| 2017/0185885 A1 | 6/2017 | Skelding et al. |
| 2018/0269352 A1 | 9/2018 | Tian et al. |
| 2019/0233655 A1 | 8/2019 | Kimpel et al. |
| 2019/0324574 A1 | 10/2019 | Schooley et al. |
| 2020/0082396 A1 | 3/2020 | Chow |

FOREIGN PATENT DOCUMENTS

| | | |
|---|---|---|
| JP | 2002260290 A | 9/2002 |
| KR | 20040111317 A | 12/2004 |
| WO | 2012002992 A1 | 1/2012 |
| WO | 2016073473 A1 | 5/2016 |

OTHER PUBLICATIONS

European Communication for European Application No. 14752098.5, dated Jan. 16, 2018, 3 pages.
Extended European Search Report for European Application No. 14752098.5, dated Feb. 3, 2017, 8 pages.
Final Office Action for U.S. Appl. No. 15/356,586, dated Sep. 13, 2018, 22 pages.

(56) References Cited

OTHER PUBLICATIONS

International Search Report and Written Opinion of the International Searching Authority for International Application No. PCT/US2014/015939, dated Aug. 25, 2014, 10 pages.
Non Final Office Action for U.S. Appl. No. 14/178,436, dated Nov. 29, 2017, 24 pages.
Non Final Office Action for U.S. Appl. No. 15/356,586, dated Apr. 2, 2018, 34 pages.
Non Final Office Action for U.S. Appl. No. 14/178,436, dated Oct. 4, 2018, 23 pages.
Non Final Office Action for U.S. Appl. No. 15/355,018, dated Oct. 29, 2018, 30 pages.
Non Final Office Action for U.S. Appl. No. 15/637,092, dated Nov. 1, 2018, 48 pages.
Non Final Office Action for U.S. Appl. No. 12/460,829, dated Nov. 13, 2018, 13 pages.
Notice of Allowance for U.S. Appl. No. 14/977,553, dated Oct. 20, 2017, 13 pages.
Entire patent prosecution history of U.S. Appl. No. 14/178,436, filed Feb. 12, 2014, entitled, "Durable Card".
Entire patent prosecution history of U.S. Appl. No. 15/355,018, filed Nov. 17, 2016, entitled, "Foil Composite Card".
Entire patent prosecution history of U.S. Appl. No. 15/356,586, filed Nov. 19, 2016, entitled, "Foil Composite Card".
Entire patent prosecution history of U.S. Appl. No. 15/637,092, filed Jun. 29, 2017, entitled "Durable Card".
Entire patent prosecution history of U.S. Appl. No. 12/006,168, filed Dec. 31, 2007, now U.S. Pat. No. 9,542,635, issued, entitled: Foil Composite Card.
Entire patent prosecution history of U.S. Appl. No. 15/521,519, filed Apr. 24, 2017, entitled "Ceramic-Containing and Ceramic Composite Transaction Cards".
Entire patent prosecution history of U.S. Appl. No. 14/718,596, filed May 21, 2015, entitled "Transaction and ID Cards Having Selected Texture and Coloring".
Entire patent prosecution history of U.S. Appl. No. 15/379,569, filed Jun. 15, 2016, entitled "Transaction and ID Cards Having Selected Texture and Coloring".
Entire patent prosecution history of U.S. Appl. No. 12/460,829, filed Jan. 27, 2011, entitled "Card With Embedded Image".
Entire patent prosecution history of U.S. Appl. No. 14/977,553, filed Dec. 21, 2015, entitled "Smart Metal Card With Radio Frequency (RF) Transmission Capability".
Non Final Office Action for U.S. Appl. No. 14/718,596, dated Jul. 23, 2020, 38 pages.
Final Office Action for U.S. Appl. No. 15/861,321, dated Sep. 16, 2020, 26 pages.
Notice of Allowance for U.S. Appl. No. 14/718,596, dated Oct. 16, 2020, 30 pages.
European Communication Pursuant to Article 94(3) for European Application No. 15874266.8, dated Aug. 24, 2020, 4 pages.
Notice of Allowance for U.S. Appl. No. 15/860,286, dated Sep. 4, 2020, 25 pages.
Final Office Action for U.S. Appl. No. 15/861,321, dated Jul. 21, 2021, 19 pages.
Non Final Office Action for U.S. Appl. No. 15/861,321, dated Dec. 21, 2021, 25 pages.
Extended European Search Report for European Application No. 21187453.2, dated Nov. 18, 2021, 8 pages.
Non Final Office Action for U.S. Appl. No. 16/508,570, dated Feb. 3, 2022, 76 pages.
Non Final Office Action for U.S. Appl. No. 16/594,591, dated Mar. 17, 2022, 60 pages.
Final Office Action for U.S. Appl. No. 15/861,321, dated Apr. 14, 2022, 32 pages.

STEP 1
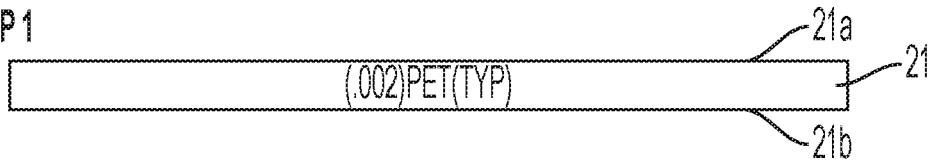
STEP 2A  Form diffraction pattern on one side of layer 21 (embossing step).
STEP 2B  Vapor deposition of aluminum on pattern
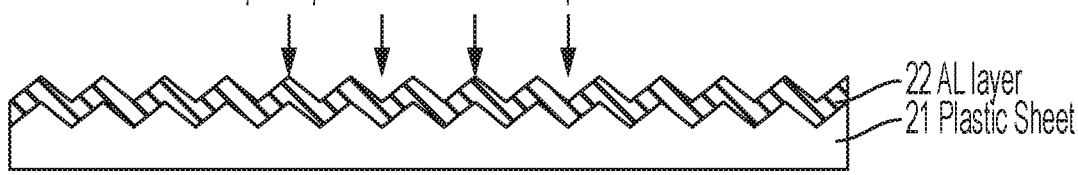
STEP 3  Apply primer (adhesive) coat 2 sides.
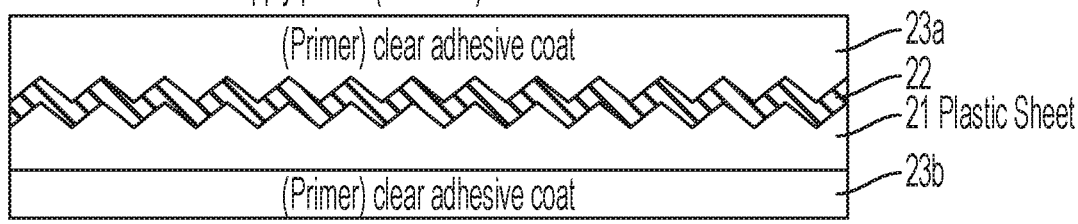
STEP 4  Apply PE adhesive and Buffer and cut sheets to image
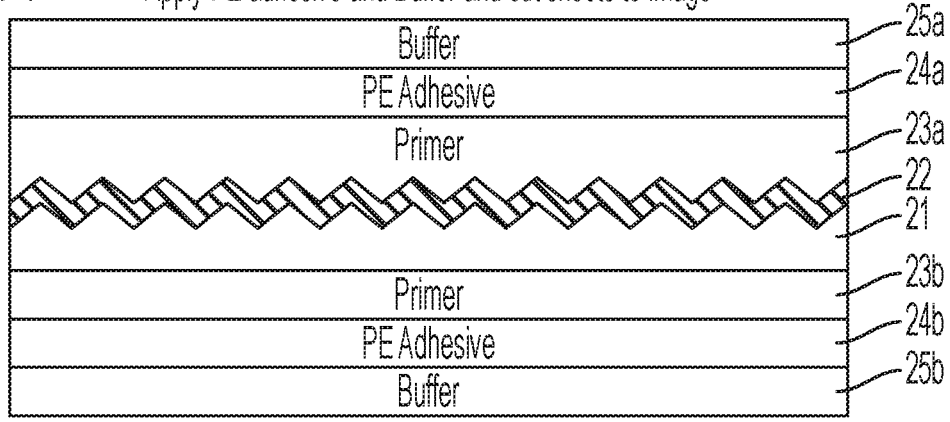
Fig. 2

STEP 1
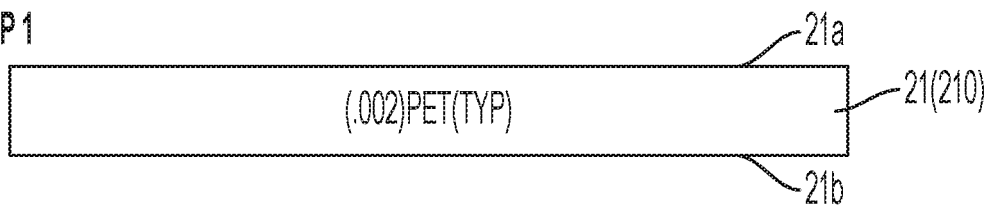
STEP 1A  Adding embossing layer
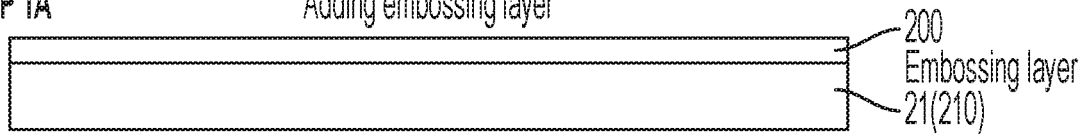
STEP 2A  Form diffraction pattern in embossing layer
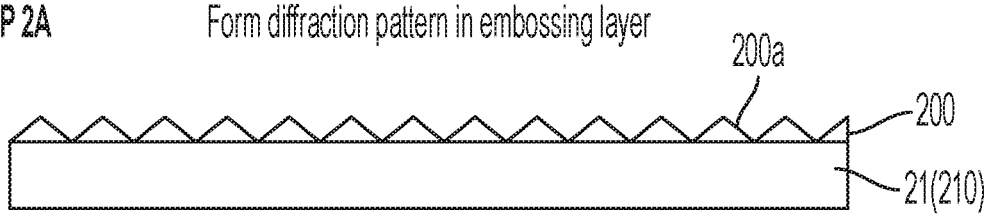
Fig. 2A

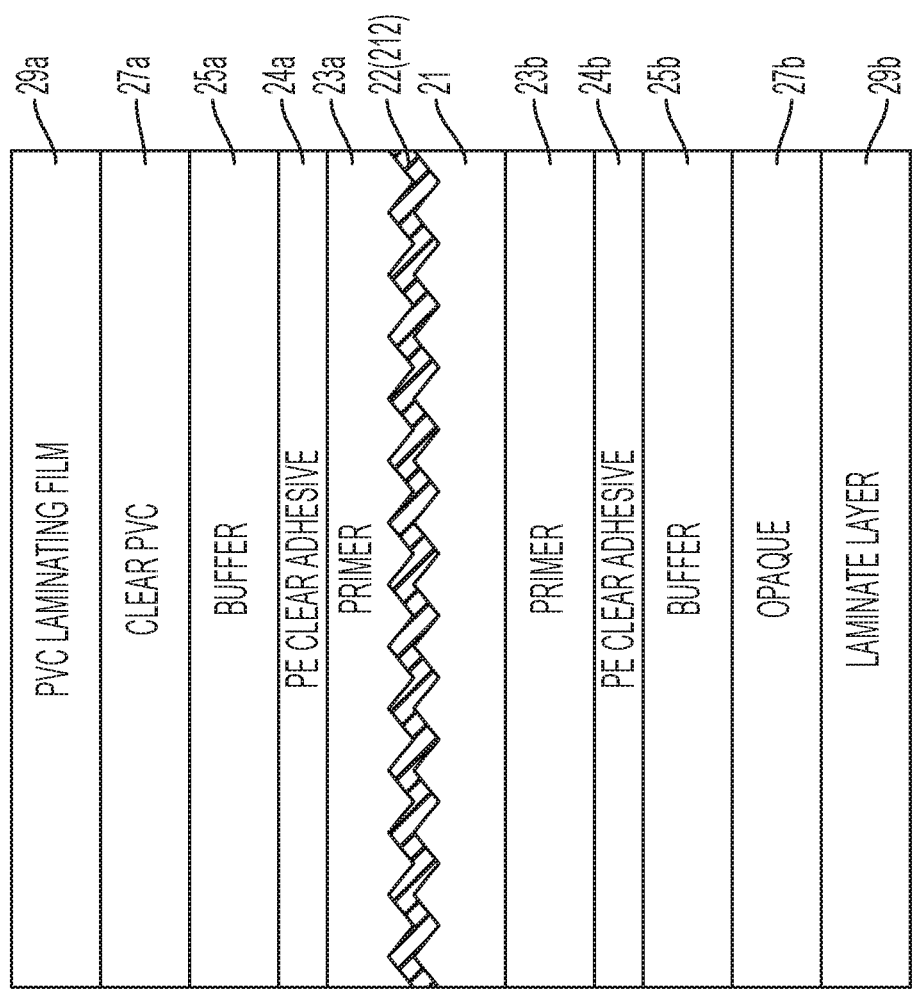

FOIL COMPOSITE CARD

CROSS-REFERENCE TO RELATED APPLICATIONS

This application is a divisional application of U.S. patent application Ser. No. 14/183,868, filed Feb. 19, 2014, which is a continuation application of U.S. patent application Ser. No. 12/006,168, filed Dec. 31, 2007 and titled Foil Composite Card, the contents of each of which are incorporated herein by reference.

FIELD OF THE INVENTION

The invention is directed to the manufacture of a multi-layered (composite) card, or any like instrument or document.

BACKGROUND OF THE INVENTION

The term "card" or "cards" as used herein, and in the appended claims, is intended to include a large variety of documents and instruments such as a financial cards, identification (including a National ID or Driver's License) cards, electronic passport pages, gift cards, documents for holding permanent and long lasting records such as medical records or security cards, or other plastic cards used for promotion of a product or organization.

Various means of producing an improved composite card are disclosed in U.S. Pat. No. 6,644,552, titled Composite Card and issued to John Herslow, the applicant of this application, the teachings of which are incorporated herein by reference. However, there remains a demand for increasing the security of the cards (documents and/or instruments) being formed and used. For example, FIG. 4 of the '552 patent, shows security elements formed in a top layer 17 and FIG. 6 of the '552 patent discusses the addition of holographic material and other security indicia after the sheets are cut into standard cards.

Thus, to increase the security of a card, it is known to form holograms on the card. Generally, the holograms may be formed by a hot stamping method at, or near, the top (or bottom) surface (level) of the card. A disadvantage to so placing the holograms is that a counterfeiter may be able to alter the card without the tampering being readily apparent to someone examining or accepting the card. Also, positioning the hologram close to the top or the bottom surface of the card creates an asymmetry in its construction, whereby, when the temperature varies, different portions (layers) of the card may be placed under different degrees of tension and contraction resulting in stresses which tend to distort the card and/or the hologram (e.g., the card fails to remain flat). Still further, when the hologram is placed at, or near, the top or the bottom surfaces it may be easily and inadvertently scratched or marred.

Due to the highly sensitive nature of the "secure" cards, of interest, it is critical that they be made tamper resistant and sturdy and to last for a long time (e.g., more than 5 years) even where high temperature levels (hot or cold) and a high degree of humidity are encountered. It is also desirable that they be relatively inexpensive to fabricate and, very importantly, that the card be virtually impossible to be altered without destroying the card or the easy detection of the alteration.

SUMMARY OF THE INVENTION

Accordingly, composite cards formed in accordance with the invention include a security layer formed at the center, or core layer, of the cards. Cards embodying the invention may include a hologram, or diffraction grating formed at, or in, the center, or core layer, of the card with symmetrical layers formed above and below the center or core layer.

A hologram may be formed by embossing a designated area of the core layer with a diffraction pattern and vapor depositing a very thin layer of metal or metal compound (e.g., aluminum, zinc sulfide, etc . . . ) on the embossed layer. Then, additional layers are selectively attached to the top and bottom surfaces of the core layer. In accordance with the invention, for each additional layer attached to the top surface of the core layer there is a corresponding like layer attached to the bottom surface of the core layer for producing a highly symmetrical structure (sandwich).

In accordance with one embodiment of the invention, all the layers are made of a clear synthetic (e.g., plastic) material, whereby the pattern formed on, or within, the core layer may be seen by looking down at the top of the card or by looking up at the bottom of the card.

The layer of metal or metal compound deposited on the core layer may be made very thin to provide a "see-through" effect, under appropriate light conditions. However, where the layer of metal or metal compound deposited on the core layer is of "standard" thickness, the pattern may only be seen from the top or the bottom side of the core.

After the hologram is formed, a laser may be used to remove selected portions of the metal formed on the embossed layer to impart a selected pattern or information to the holographic region. In accordance with the invention, this step in making a card or a set of cards may be performed when the card or cards being processed are attached to, and part of, a large sheet of material, whereby the "lasering" of all the cards on the sheet can be done at the same time and relatively inexpensively.

In accordance with the invention a hologram may be formed in the core portion of card and if the hologram includes a metal layer, laser equipment may be used to modify and/or alter the metal pattern at selected stages in the process of forming the card. Alternatively, after the sheets are die-cut into cards, each card may be individually "lasered" to produce desired alpha numeric information, bar codes information or a graphic image.

Embodiments of the invention may include the use of a polyester film, or any other carrier, which includes a metallic or a high refractive index (HRI) transparent holographic foil that is pre-laminated between two sheets of a material (which could be PVC, PET or other thermo-plastic resin) that has a thermo-plastic adhesive (which may have, but not necessarily has, been previously applied). The pre-laminated holographic foil can have an unlimited number of patterns and may also be configured to include one, or several individual, hologram designs repeated in rows and columns across an entire sheet. The holographic design may also have the appearance of full metal, or partial metal and partial white coverage (white reflecting hologram) on each individual card in the matrix. Utilizing this holographic foil pre-laminate in concert with standard plastic card materials, enables a plastic card manufacturer to produce "full-face" foil pattern design cards, or "full-face" registered hologram cards.

These cards would include the holographic foil pre-laminate as the center sheet in a standard card composition. Utilizing the center sheet composition with a metal layer, the subsequent plastic card could be laser engraved using a standard YAG laser or any other suitable laser, thus removing the metal or material coatings of the holographic layer in one or more of the following: an alpha numeric, barcode or graphic design. The end result is an inexpensive foil composite card that has a unique individualized holographic layer that has been permanently altered.

If a potential counterfeiter attempted to disassemble the card in order to compromise the integrity of the information contained on, or in, the card, it would cause a change in the hologram resulting in the hologram being irreparably damaged. Therefore, plastic cards formed in accordance with the invention are truly tamper resistant and are more secure foil cards than any of the known commercially available cards.

BRIEF DESCRIPTION OF THE DRAWINGS

In the accompanying drawings (which are not drawn to scale) like reference characters denote like components, and:

FIG. 2 is a diagram detailing some of the steps in forming a card embodying the invention;

FIG. 2A is a diagram detailing the application of an embossing layer to a core layer to form a card embodying the invention;

FIG. 6A is a cross sectional diagram of a card embodying the invention where one, or more, of the layers block the light;

DETAILED DESCRIPTION OF THE PREFERRED EMBODIMENTS

Figure 1:
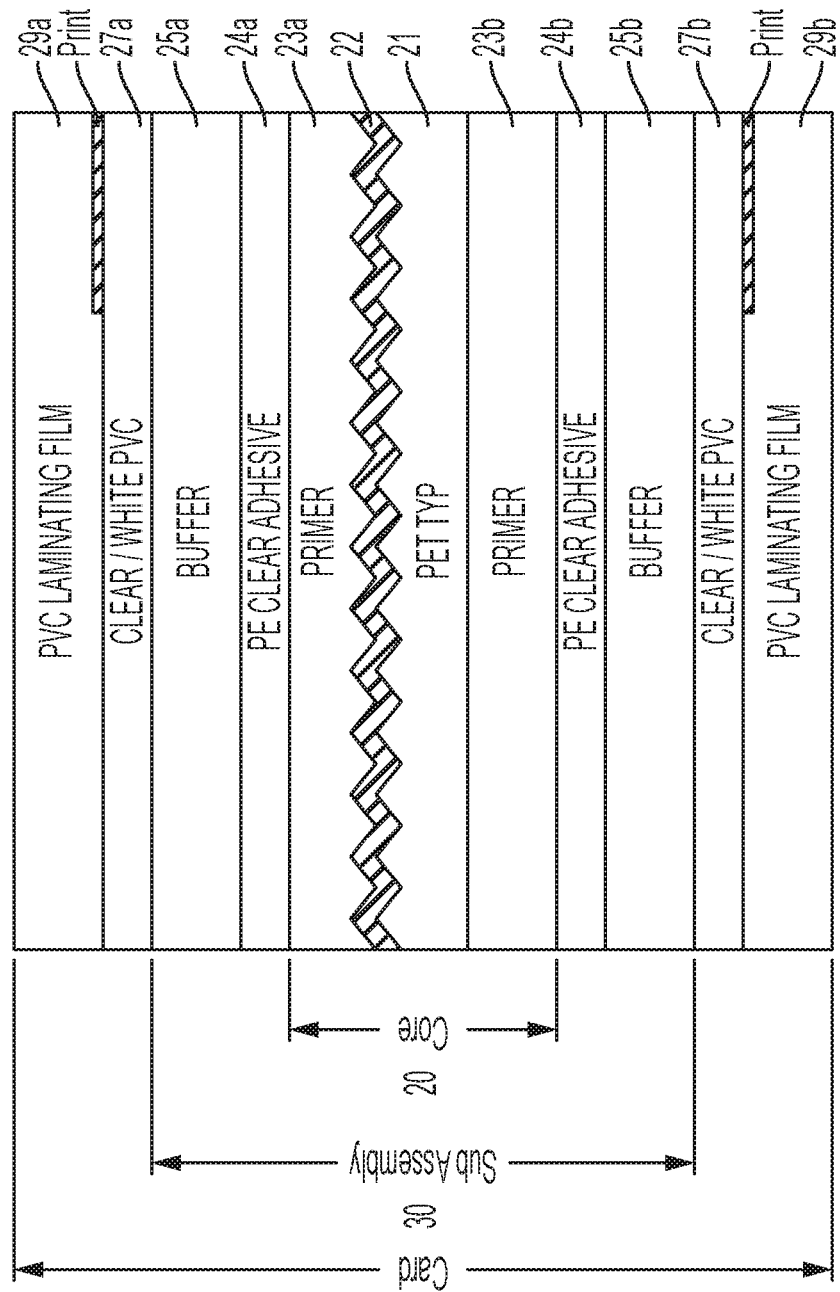
FIG. 1 is a cross sectional diagram of part of a card (instrument) embodying the invention.

Referring to FIGS. 1, 2 and 2A, there is shown a core 20 comprised of a base layer 21 of a plastic material, which may be, for example, oriented polyester terephthalate (OPET) or polypropylene, or polystyrene, or any number of acrylics and/or a combination of these materials. The base layer 21 is shown to have an upper surface 21a and a lower, or bottom, surface 21b. For purpose of illustration, a pattern is shown to be formed on, or above, surface 21a of layer 21. However it should be understood that, alternatively, the pattern could be formed on surface 21b. Two different methods of forming a pattern are shown in FIGS. 2 and 2A. The surface 21a of layer 21 in FIG. 2 is embossed with a diffractive or holographic pattern. In FIG. 2A, the surface 21a of layer 21 is coated with an embossing layer 200 which is then embossed with a diffractive pattern, 200a.

A layer 22 of aluminum (or any suitable metal or metal compound such as Zinc Sulfide) may then be vapor deposited on the diffraction pattern to form a hologram. The use of vapor deposition is very significant in that it permits a very thin layer 22, a few atoms thick, to be formed on surface 21a and thus complete the formation of the hologram, using small amounts of metal. Using vapor deposition, the thickness of the layer can be made very thin so it is nearly transparent and can provide a "see-through" effect. Alternatively, the metal layer can be made a little thicker so as to be more opaque.

As detailed in step 3 of FIG. 2, a clear adhesive primer layer 23a, may be coated over the patterned and metallized top surface (21a) and a similar clear adhesive primer layer 23b may be coated over the bottom surface (21b) of the layer 21. The core 20 is completed by attaching these clear adhering layer (23a, 23b) above and below the embossed base layer 21. The clear layer 23a, 23b, is a primer coating. It may be polyethylenamine or an acrylic based, or other, organic adhesive compound with solvent or water based carriers. The primer coatings 23a, 23b are fairly thin and yet fairly strong/sturdy. They also function to promote adhesion to layers 24a, 24b which are attached to the core 20.

As detailed in step 4 of FIG. 2 clear PE adhesive layers 24a, 24b may then be formed/attached to the top (outer) surfaces of their respectively layers 23a, 23b. Layers 24a, 24b may be of polyethylene (PE) material, or polypropylene (PP), or high density polypropylene (HDPP), or ethylene Vinyl Acetate (EVA), or any of the different forms of PET or any of like materials, or mixtures of these materials. The clear materials used to form layers 24a, 24b may contain other clear adhesion promoting compounds (e.g., ethyl acrylates, acrylic acid, etc . . . ). The layers 24a, 24b may be fairly thick and function to attach to the thin embossed hologram layer and coatings of core 20. For handling purposes, buffer layers 25a, 25b may then be formed/attached to the top (outer) surfaces of layers 24a, 24b to complete what is defined as subassembly 30. For example, buffer (carrier) layer (25a, 25b) may be laminated to the top and bottom of adhesive layers 24a, 24b. Subassembly 30, is thick enough to be handled by automatic credit card manufacturing equipment.

In one embodiment, the base layer 21 was approximately 0.002 inches thick and the adhesive backed layers (23a, 23b) were each made to be approximately 0.0001 to 0.0003 inches thick. In other embodiments the layers 23a, 23b could be made either thinner or much thicker.

In still other embodiments, adhesive layers can be coated over the buffer or carrier layer and the two (i.e., the carrier and buffer layers on each side of a holographic layer) can be combined with the holographic layer. That is, adhesive can be applied to either side of the carrier foil interface and then pre-laminated together (3 sheets laminated to become one laminate; i.e., the prelaminate prior to platen lamination. Thus, the carrier sheet can hold the sub-assemblies for transfer to substrates for forming cards.

Examining FIG. 2 in greater detail note some of the steps used in forming the core 20.

As shown, for example, in step 1, the base component may be a sheet 21 of plastic (e.g., PET or OPET or polypropylene, or polystyrene, or polymethyl, methacrylate, etc . . . ) material whose thickness typically ranges from 0.0005 inches to more than 0.005 inches. In one embodiment layer 21 was made, for example, 0.002 inches thick.

Then, as shown in step 2A, which may be termed an embossing step, a diffraction pattern may be formed on one side of layer 21. A diffraction pattern may be formed directly in the plastic layer 21 by embossing (e.g., stamping) pattern(s) therein. Forming the pattern in a sheet of plastic (or in an embossing layer, as discussed below) is easier and less wearing on the embossing (stamping) equipment than forming a like pattern in a metal layer.

Then, as shown in step 2B a hologram is formed on one surface (21a) of plastic sheet 21 by vapor deposition of a metal layer (e.g., aluminum onto the diffraction pattern. Thus, the hologram may be formed by embossing the top surface 21a to form a diffraction pattern and then metallizing the pattern. The surface 21a may be coated by the vapor deposition of aluminum (or similar light reflective materials such as nickel, silver, zinc, or other like materials). A significant advantage of using vapor deposition (although many other methods may be used) is that very small amounts of the metal (light reflective material) need to be used to form the hologram resulting in a significant savings in the cost of manufacturing the card (or instrument). Also, very thin layers allow a controllable amount of light to pass through. This enables the manufacture of a card, or document, in which an image (hologram) formed on a card is reflected (i.e., is visible) while also enabling a viewer to "see-through" the image.

Then, as shown in step 3 of FIG. 2, clear adhesive or "primer" coats 23a, 23b may be applied to the top and bottom surfaces 21a, 21b, respectively, of plastic sheet 21. The primer coat also functions to fill in the ridges resulting from the formation of the diffraction grating. The clear layers 23a, 23b which may be of the type described above, may be attached to the top and bottom surfaces of "embossed" plastic sheet 21 on which the aluminum has been vapor deposited. Primer layers 23a, 23b may be attached to base layer 21 by any one of a number of methods, such as, for example, gravure coating, roller coating, flexography or other like methods. The primer secures the bond to both sides of the holographic sheet (the embossed side and the blank side). This completes the formation of what is defined herein as the core assembly 20.

Then, as shown in step 4 of FIG. 2, the PE layers 24a, 24b, or any other suitable layer, as noted above, which function as an additional buffer between that bond and the outer buffer layers 25a, 25b are attached to the core assembly. The PE layers 24a, 24b may also include an adhesive which promotes adhesion to the clear primer layers 23a, 23b attached to the top and bottom surfaces of layer 21. Layers 24a, 24b, 25a, 25b may be attached to each other and to the underlying layers by any one of a number of methods such as, for example, platen lamination, hot roll lamination, liquid adhesive lamination.

Thus, as shown in step 4 of FIG. 2, a clear buffer layer 25a is attached to the PE layer 24a and a clear buffer layer 25b is attached to the PE adhesive layer 24b. All of layers 24a and 24b and layers 25a, 25b function as buffers, providing additional strength to the structure and at the same time protecting the hologram from being damaged or tampered with. Adding layers 25a and 25b completes the sub-assembly 30 which may then be customized to form cards with additional information.

By forming the hologram at, and within, the core level, the hologram will not be easily, or inadvertently, damaged since several additional layers will be attached to the top and bottom of the holographic layer. It is also not subject to easily being tampered or altered. Forming the hologram at the center of the structure minimizes the possibility of tampering while fully protecting the hologram. Another significant advantage of forming the hologram at the core of the structure is that the top and bottom surfaces stay flat due to equal shrinking and/or expansion of all the layers. Note that the card structure is formed so as to be symmetrical about the core layer.

FIG. 2A illustrates another method of forming the hologram. As shown in Step 1A of FIG. 2A, a clear embossing layer 200 may be coated directly over a layer 21 (or 210). Alternatively, a primer coating may be formed on layer 21/210 and then the embossing layer 200 may attached/formed to the primer coating. The embossing layer may be composed, for example, of siloxane, acrylic, vinyl, linear polyester, urethane or any like materials and may be several (e.g., less than 0.5 to more than 5) microns thick. The embossing layers may also be deposited as liquids and radiation cured, possibly in two steps—first as a soft easily embossable coating which then becomes hard and impervious. As shown in step 2A of FIG. 2A, a diffraction pattern is embossed (formed) in the embossing layer/coating 200 to form a desired pattern. Forming a pattern in the embossing layer may be desirable since it is even easier and less wearing on the embossing (stamping) equipment than forming a like pattern directly in the PET layer (as per FIG. 2). After the pattern is embossed on and within the embossing layer 200, the sheet may be processed as per steps 2B, 3 and 4 shown in FIG. 2.

Note that a hologram may be formed by, for example, embossing a pattern in a carrier base material (e.g., a hard polyester) or by embossing the pattern in a coating previously applied to the carrier base material, or by embossing the pattern in a metal which was previously deposited onto the base carrier material or by depositing the metal onto a soft coating and then embossing.

Referring back to FIG. 1, note that the core 20 may be part of a subassembly 30 which includes attaching layers 24a, 24b of clear PE and buffer layers 25a, 25b to the top and bottom surfaces of the core 20. Layers 25a, 25b, may range in thickness from 0.001 to 0.005 inches, or more, and may be composed of PVC like materials.

The subassembly 30 may then be used to form a card, or any instrument, by attaching a layer 27a, 27b of clear or white PVC material to the top and bottom surfaces of the subassembly 30. As illustrated in FIG. 1, information can be printed either on the outer surface (the surface facing away form the core) of layers 27a, 27b or on the inner surface or both. The printed information may include, for example, fixed data fields and advertising, and/or any other desired information. The card (or instrument) may be completed by adding clear PVC laminating films 29a, 29b to the top and bottom surfaces of the card.

Figure 3:
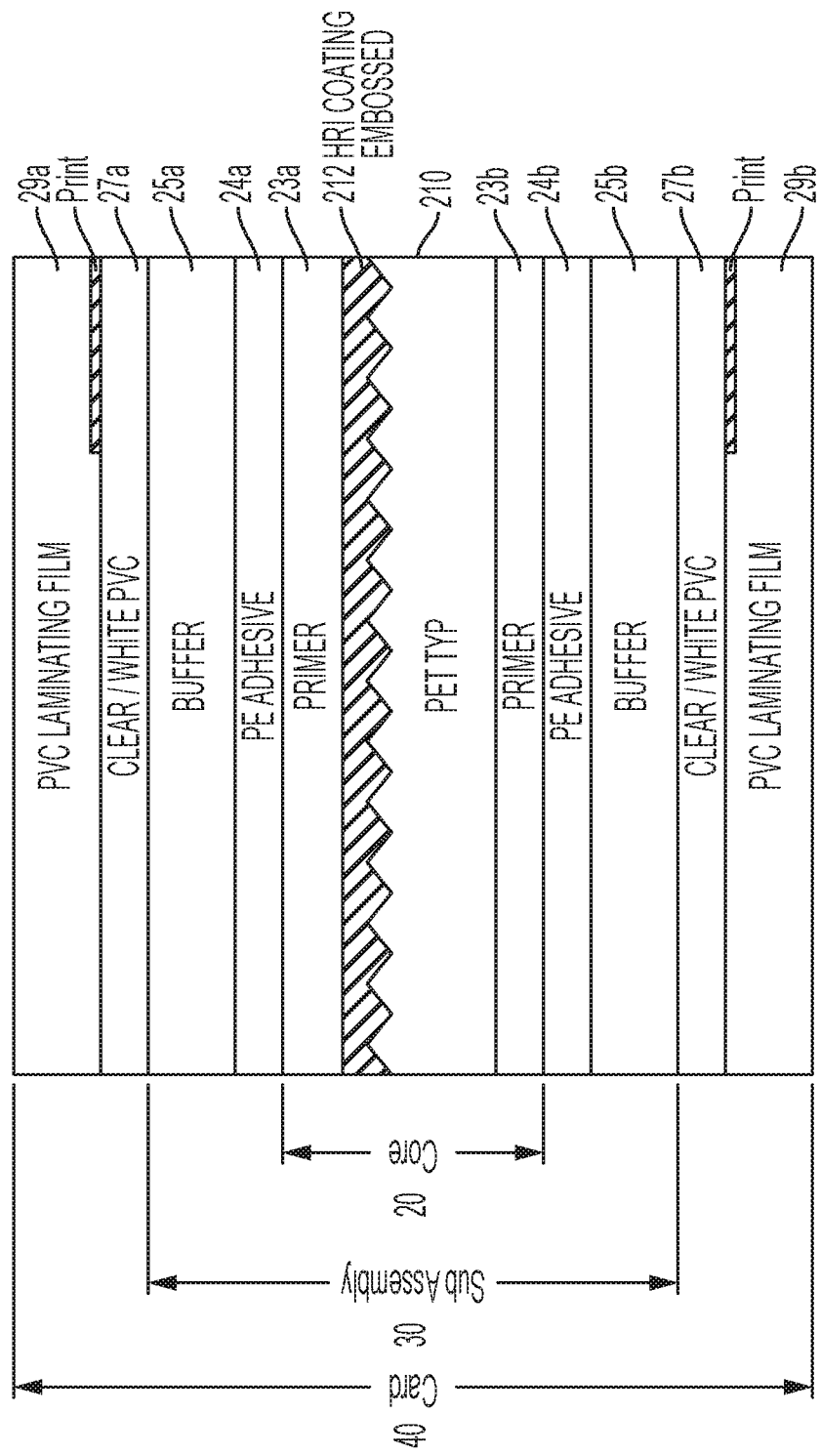
FIG. 3 is a cross sectional diagram of part of a card embodying the invention where the core layer includes a transparent material having a high refractive index.
Figure 3A:
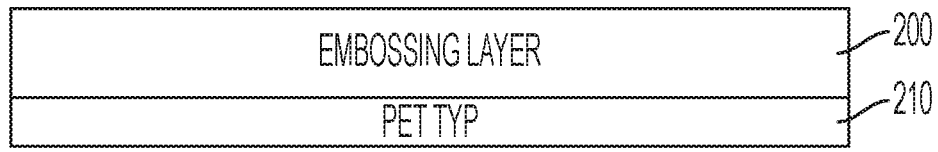
FIGS. 3a, 3b, 3c, 3d, are cross sectional diagrams of steps in forming a card embodying the invention.
Figure 3B:
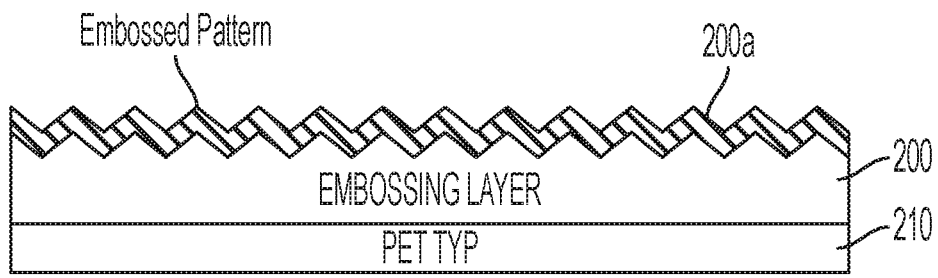
Figure 3C:
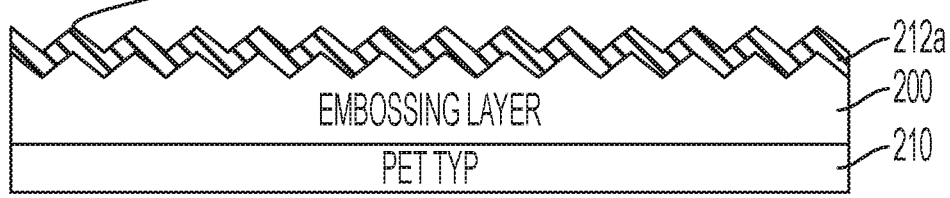
Figure 3D:
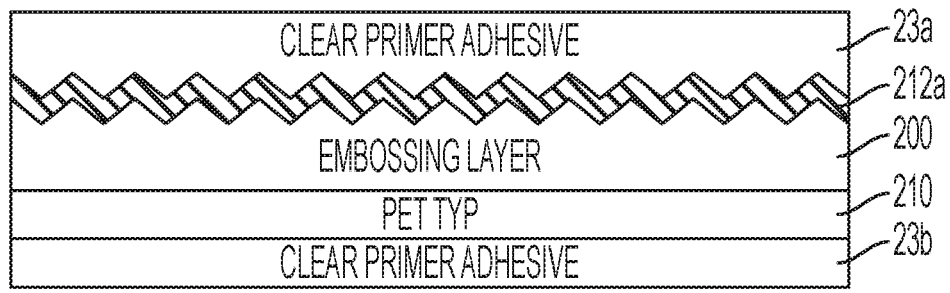

FIG. 3 is a cross-sectional diagram (not to scale) of a card embodying the invention. FIG. 3 includes a core comprised of a layer 210 which may be (but not be) of the same material as layer 21. In FIG. 3, the top surface 210a of layer 210 is embossed with a diffraction pattern giving a unique pattern to the structure. A high refractive index (HRI) layer 212 can then be vapor deposited on the embossed layer. Due to the HRI property of layer 212, there is no need to further metallize the layer. The HRI layer may be formed of zinc sulfide or zinc oxide or any material having like properties. Clear primer layer 23a is attached to the top of HRI layer 212 overlying layer 210 and primer layer 23b is attached to the bottom of layer 210.

Then, as shown in FIG. 1, clear layers 24a and 24b, which may be of PE or any other suitable materials, are attached to layers 23a and 23b, respectively and additional layers (25a, 25b) of clear (translucent) material may be attached to the top and bottom layers of layers 24a, 24b to form the subassembly 30. Additional layers 27a, 27b may be attached to the top and bottom layers of the sub-assembly. Information may be written or printed in any known manner on, or in, the layers 27a, 27b. Subsequently, laminating films 29a, 29b, may be attached to the top and bottom intermediate layers 27a, 27b to produce a card 40 whose core contents cannot be altered without essentially destroying the card.

FIGS. 3A, 3B, 3C, 3D and 3E illustrate the forming/coating of an embossing layer 200 on stock (e.g., PET) material 210 (FIG. 3A), then embossing layer 200 with a diffraction pattern 200a (FIG. 3B), then vapor depositing an HRI layer 212a on the diffraction pattern (FIG. 3C), then coating clear primer layers 23a, 23b above layer 212a and below layer 210 (FIG. 3D) to form a core assembly 20. Then clear PE adhesive layer 24a is formed above prime layer 23a and clear PE adhesive layer 24b, is formed below layer 23b (FIG. 3E). Note that the steps and thicknesses of the layers to form the basic structures discussed above are summarized in Table I, below.

Figure 4:
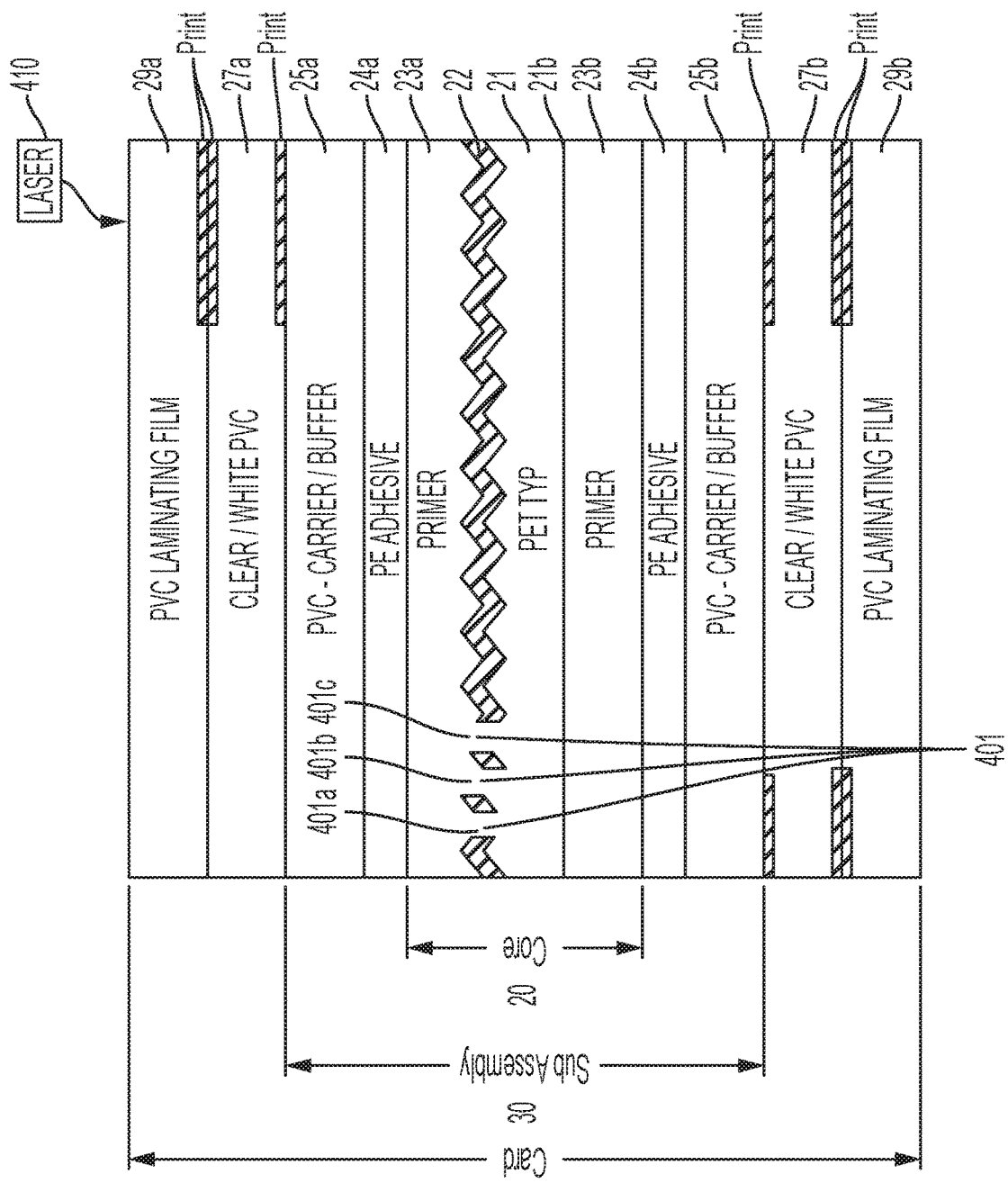
FIG. 4 is a diagram of the cross section of part of a card embodying the invention to which a laser beam is applied to form an additional ablated pattern in a metal layer in accordance with the invention.

FIG. 4 includes a cross-sectional diagram (not to scale) of a portion of a card embodying the invention, which may be part of a sheet (not shown) on which a large number of cards are formed, and depicts a piece of laser equipment 410 for "lasering" (e.g., engraving or vaporizing) metal layer 22. The core assembly 20 is shown to have a layer 22 of aluminum deposited and embossed as discussed for FIGS. 1, 2, and 2A, above. Portions of the metal layer may be vaporized (see sections 401a, 401b, 401c) by the laser equipment 410 such that portions of the metal are selectively removed or "ablated" by "lasering" (e.g., eliminating or vaporizing) the metal to form any number of different patterns (e.g., graphic as well as alpha numeric information may be generated). The clear layers 29a, 27a, 25a and 24a may be selected to be transparent to the laser wavelength. Consequently, the laser beam can pass through the clear layers of the card to "write" on the holographic layer below the top surface of the card. The laser 410 may be applied at several different stages of the card manufacturing process to form the desired patterns. Thus, the laser may be applied to "write" on the metal layer after the core 20 is formed and before the attachment of the carrier layers 24a, 24b and 25a, 25b. Alternatively, the laser 410 may be applied to form the desired pattern in the metal layer after the layers 24a, 24b, and 25a, 25b are attached to the core layer, and before layers 27a and 27b are attached. Still further, the laser may be applied to form the desired pattern in the metal layer after the layers 27a, 27b are attached and before the layer 29a, 29b, are attached. Finally, the laser may be applied to form the desired pattern in the metal layer after the layers 29a, 29b are attached, when the cards may be part of a full sheet or in individual card shape.

Figure 5:
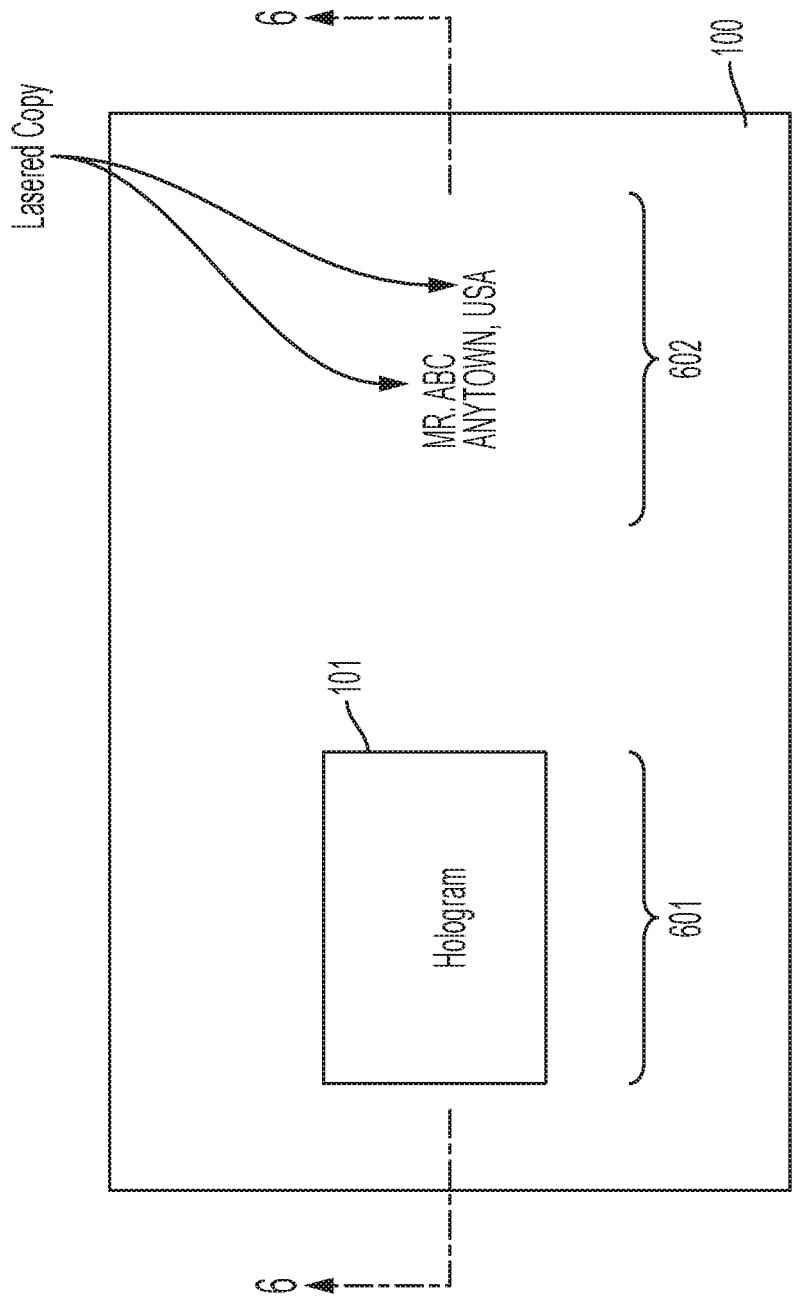
FIG. 5 is a diagram of a top view of a card including a holographic portion formed in accordance with the invention.

FIG. 5 shows a top view of a card 100 illustrating that the hologram may be ted within a designated window or area 101, shown in portion 601. Alternatively the hologram may extend the full length and/or width of the card 100. Note that alpha numeric information may be produced by lasering within the holographic layer (e.g., layer 22 in FIG. 4 shown in portion 602). Also, alpha numeric information may be produced by printing information on, or within, layers 27a, 27b, as discussed above.

Figure 6:
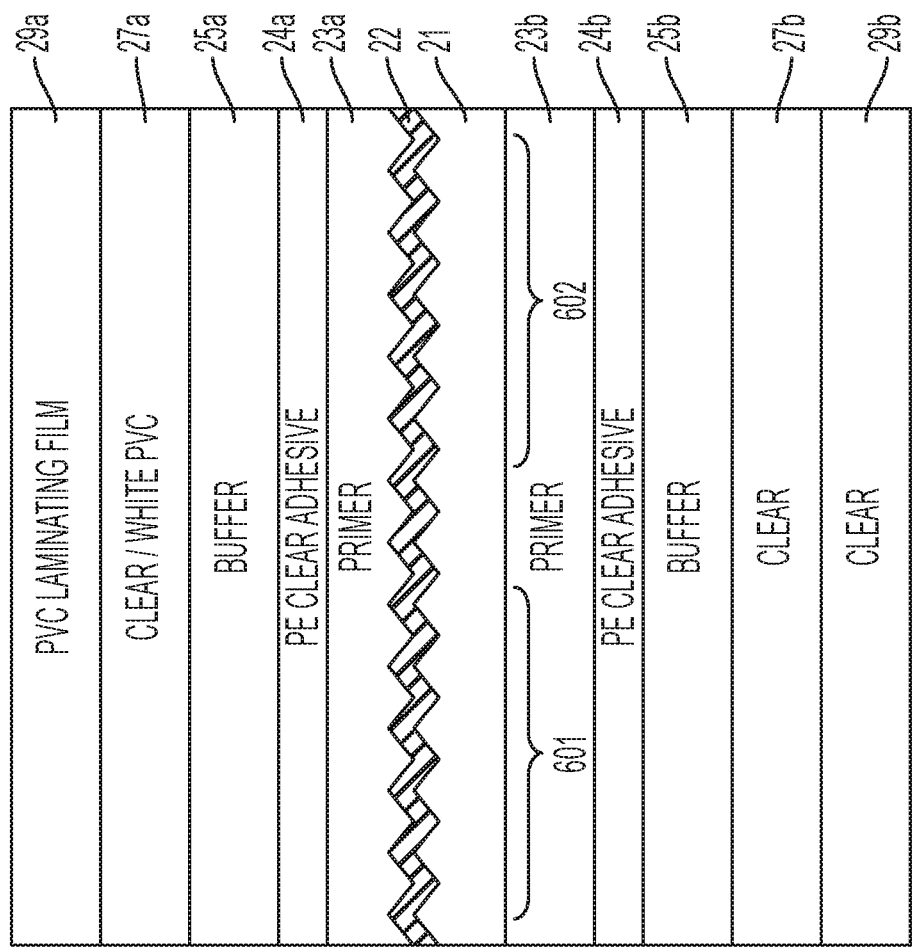
FIG. 6 is a cross sectional diagram of a card shown in FIG. 5 where all layers are made of clear (transparent) materials.

FIG. 6 is a cross-sectional diagram (not to scale) of card 100 of FIG. 5 and is intended to show that the layers above and below the holographic layer, 21, 22/212, may be transparent or translucent to yield a "see-through" card with the hologram portion 601 and the lasered portion 602 being visible from the top side or from the bottom side of the card. Note that if layers 27a, 27b are made of a white material a bright light may be needed to observe the "see-through" effect.

FIG. 6A is a cross-sectional diagram (not to scale) intended to show that the layers above the holographic layer 21, 22/212, may be transparent or translucent so the holographic pattern may be seen from the top. At the same time, one or more of the layers below the holographic layer (e.g., 27b or 29b) may be opaque so as to block the hologram from being seen from the bottom. Making the top portion of the card transparent and the bottom portion opaque is by way of illustration and the reverse could be done instead.

Figure 7:
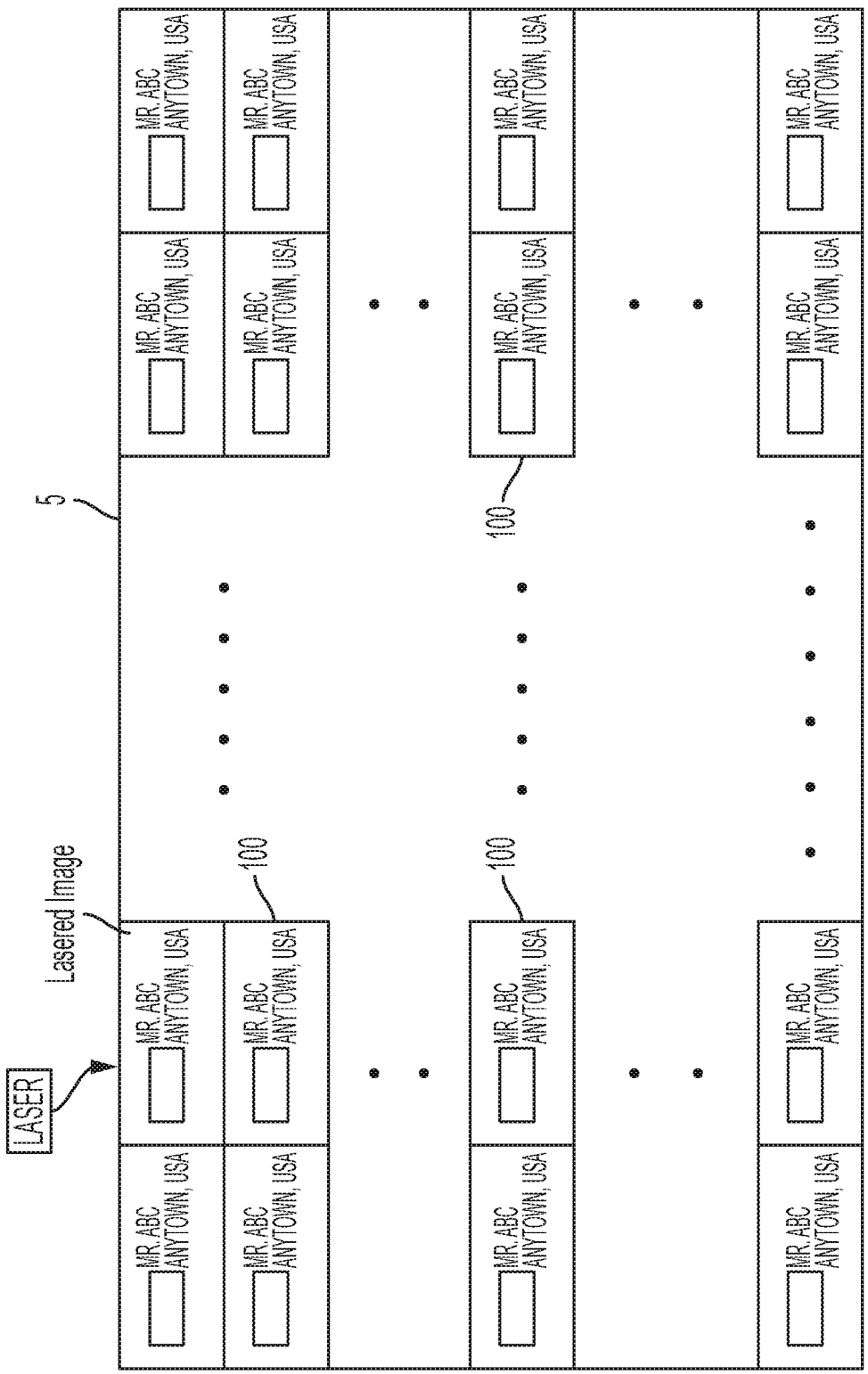
FIG. 7 is a top view of a sheet containing an array of cards illustrating that a laser beam can be applied to all of the cards on the sheet.

FIG. 7 shows the application of a laser beam generated by laser equipment 410 to a sheet 5 containing a large array of cards 100 in sheet form embodying the invention. The laser may be applied to the entire sheet of cards which may be at the core stage, the sub-assembly stage, or any of the stages thereafter. Being able to apply the laser beam in this manner, at any time before the cards are separated from a sheet, is economically advantageous and saves much in the cost of handling and also adds significant additional security.

Figure 8:
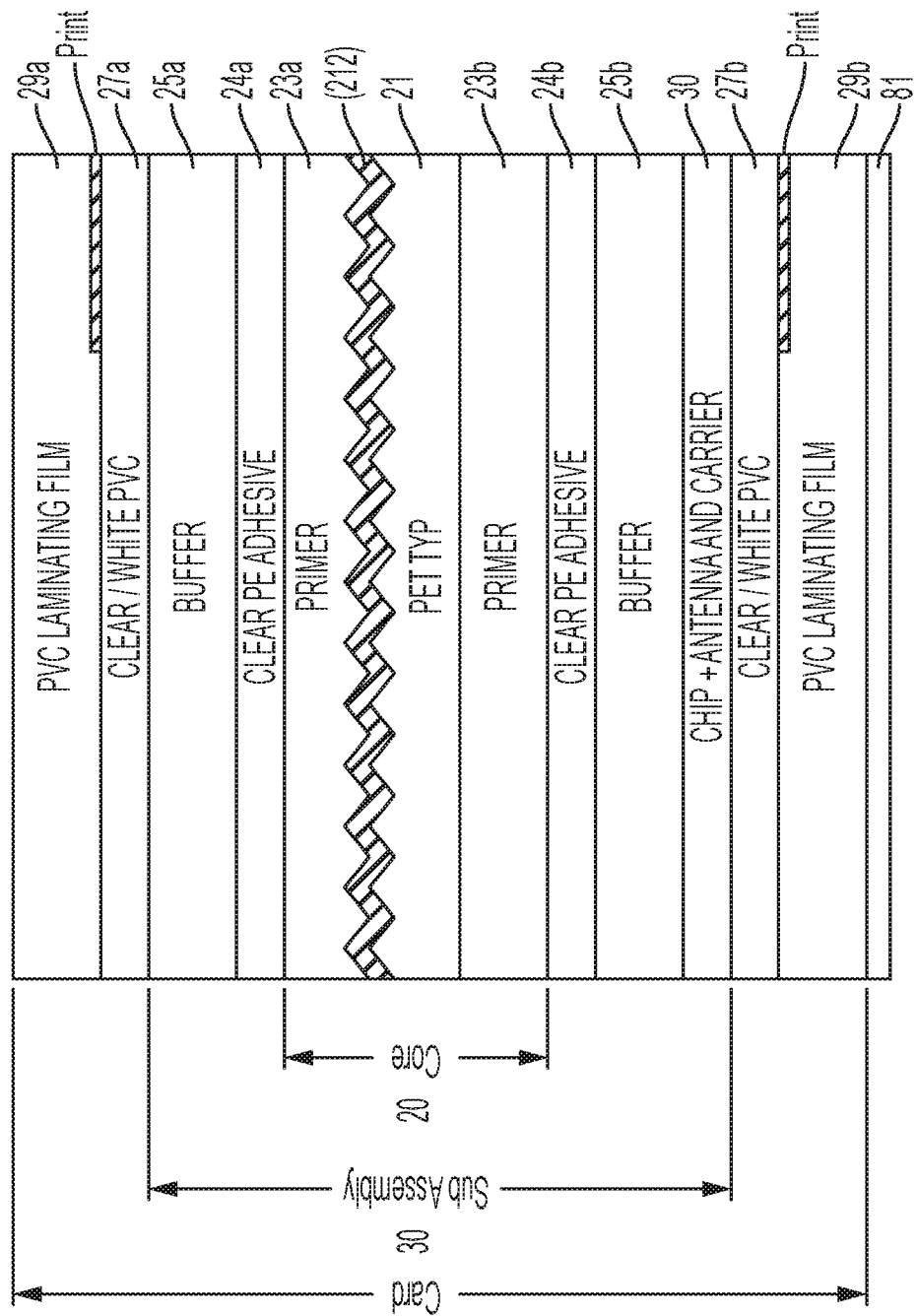
FIG. 8 is a cross sectional diagram of a card with an integrated circuit (IC) chip and antenna embodying the invention.

FIG. 8 illustrates that cards embodying the invention, shown in the various figures, may be modified by the addition of a semiconductor chip containing selected electronic circuits (an integrated circuit, IC) within the body of the card in, or within, a layer 30 dedicated to include an antenna carrier, with the antenna being connected to the chip module. This enables the manufacture of a radio frequency identification (RFID) card. Note that the metal layer 22/212 can act as a radio frequency shield to reduce reception from that side of the RFID antenna.

Figure 9:
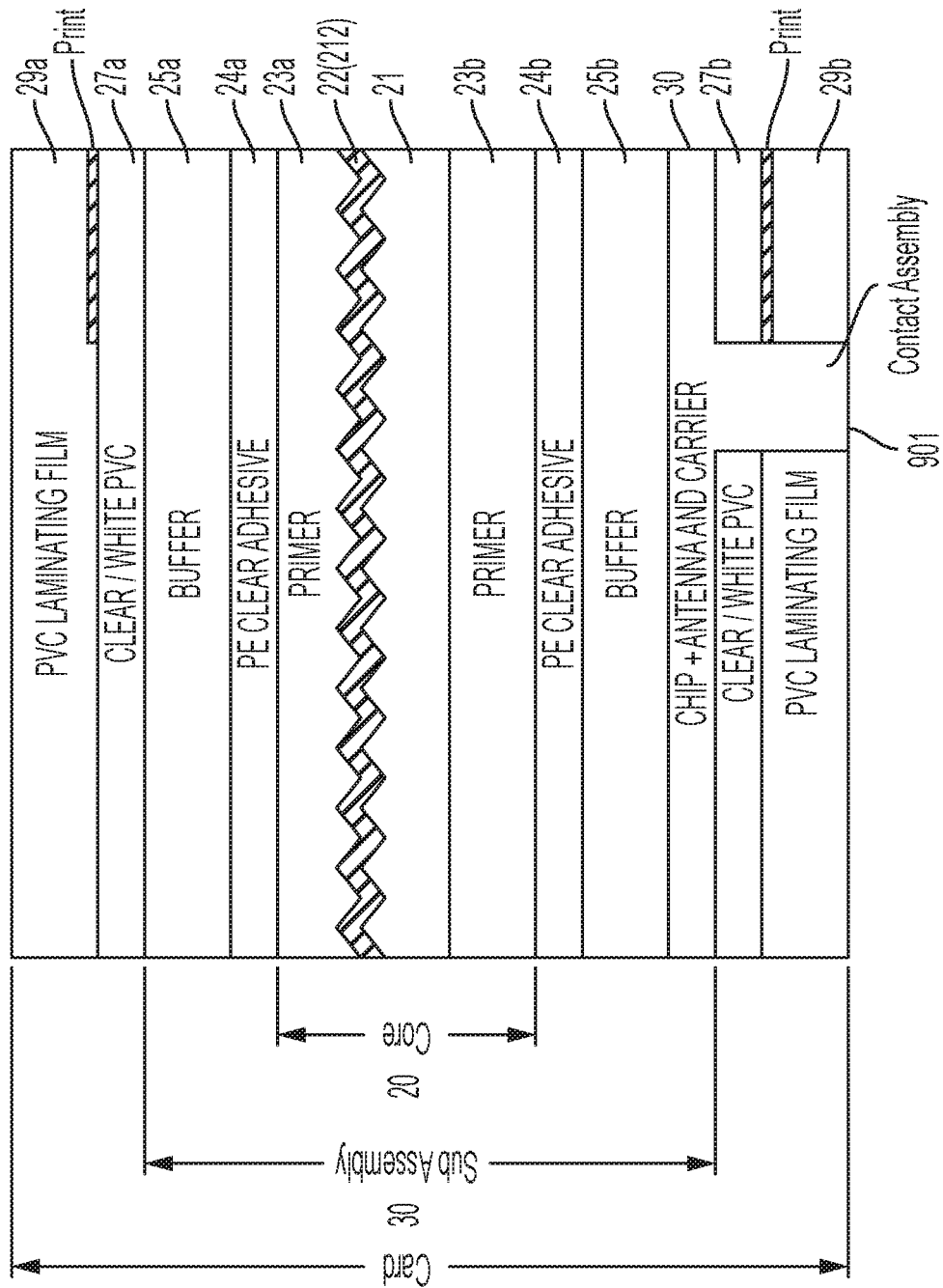
FIG. 9 is a cross sectional diagram of a dual interface card embodying the invention.

FIG. 9 illustrates that the chip (IC) and an antenna and carrier may be formed within a layer of the card and that, in addition, the chip may be accessed (read) by providing an external contact 901 along one side of the card. This type of card may be referred to as a dual interface card since it enables information on the card to be read or written via RFID and contact.

Figure 10:
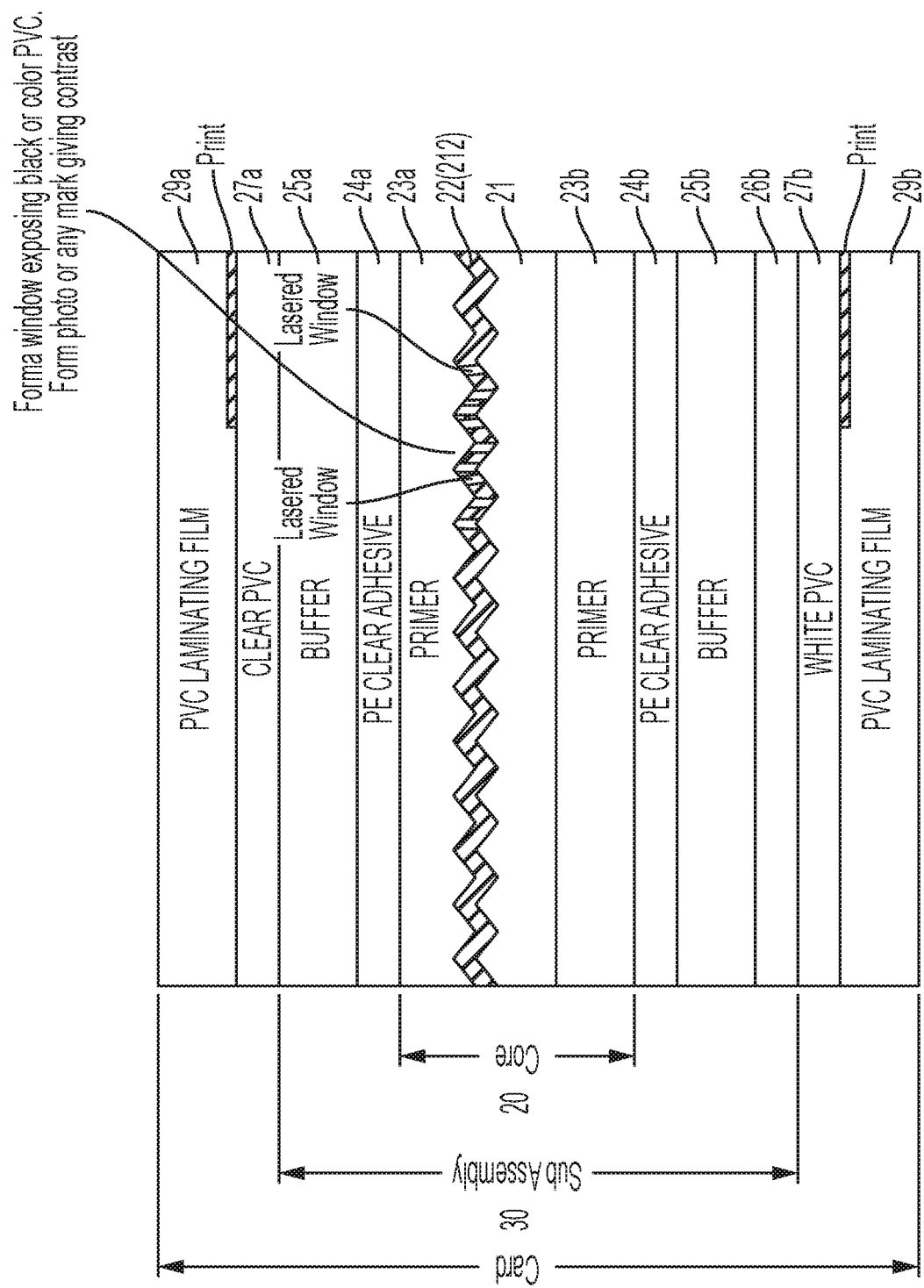
FIG. 10 is a cross sectional diagram of a card with a lasered window embodying the invention.

FIG. 10 illustrates that a window or opening can be formed by lasering through the metal layer within core layer 20 to enable the color or pattern of an underlying layer (e.g., 27b) to be seen from the top side of the card. Lasering through the metal layer forms (or opens) a window exposing an underlying layer (e.g., 27b) which may be black or white or colored or be of any preset pattern.

Figure 11:
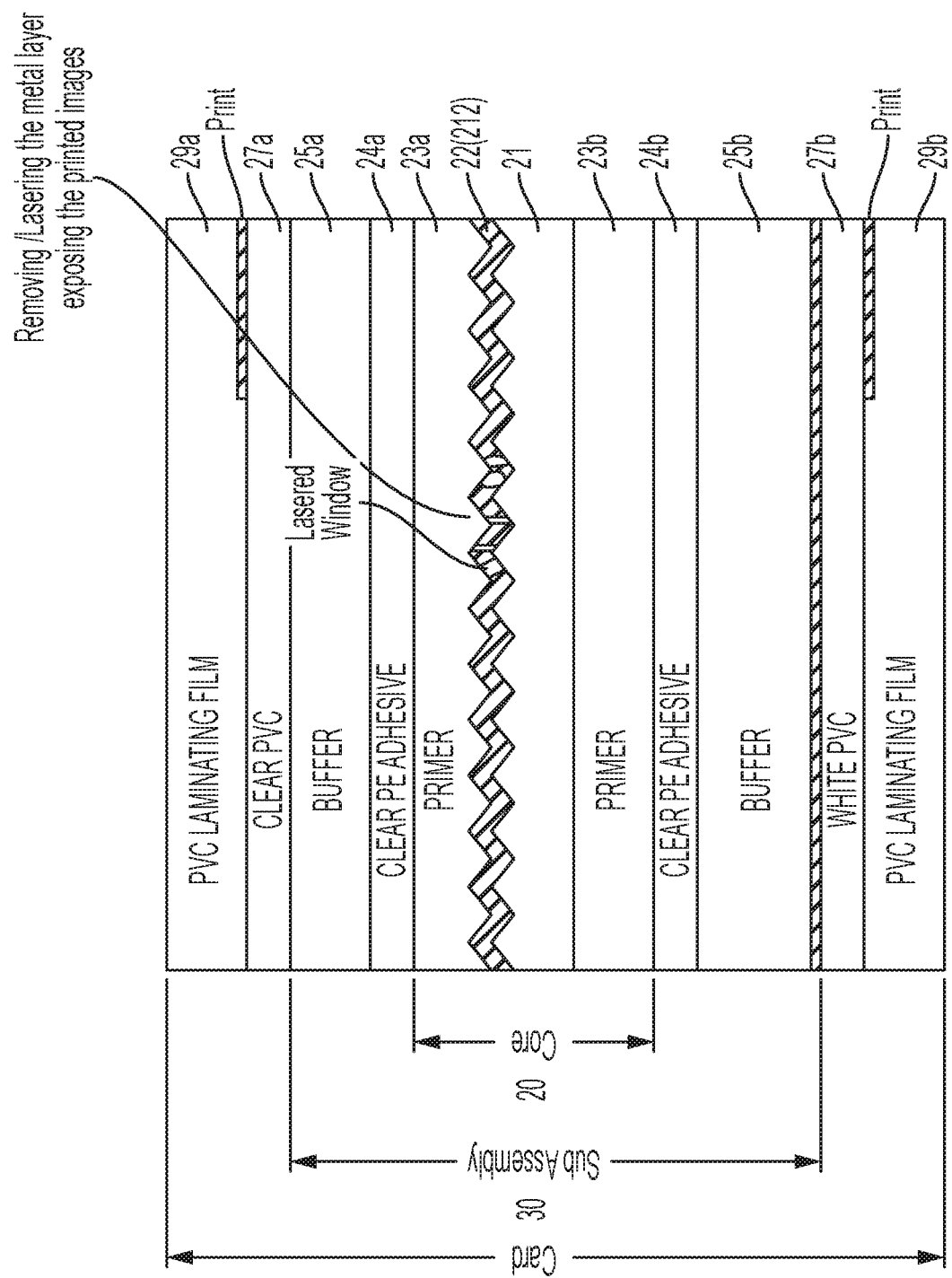
FIG. 11 is a cross sectional diagram of another card with a lasered window embodying the invention.

FIG. 11 illustrates that a window or opening can be formed by lasering the metal layer within core layer 20 to enable a preprinted image formed on an underlying layer (e.g., 27b) to be seen from the top side of the card. Here again lasering through the metal layer forms a window enabling the seeing or reading of a pre-printed pattern on an underlying layer (e.g., 27b).

Figure 12:
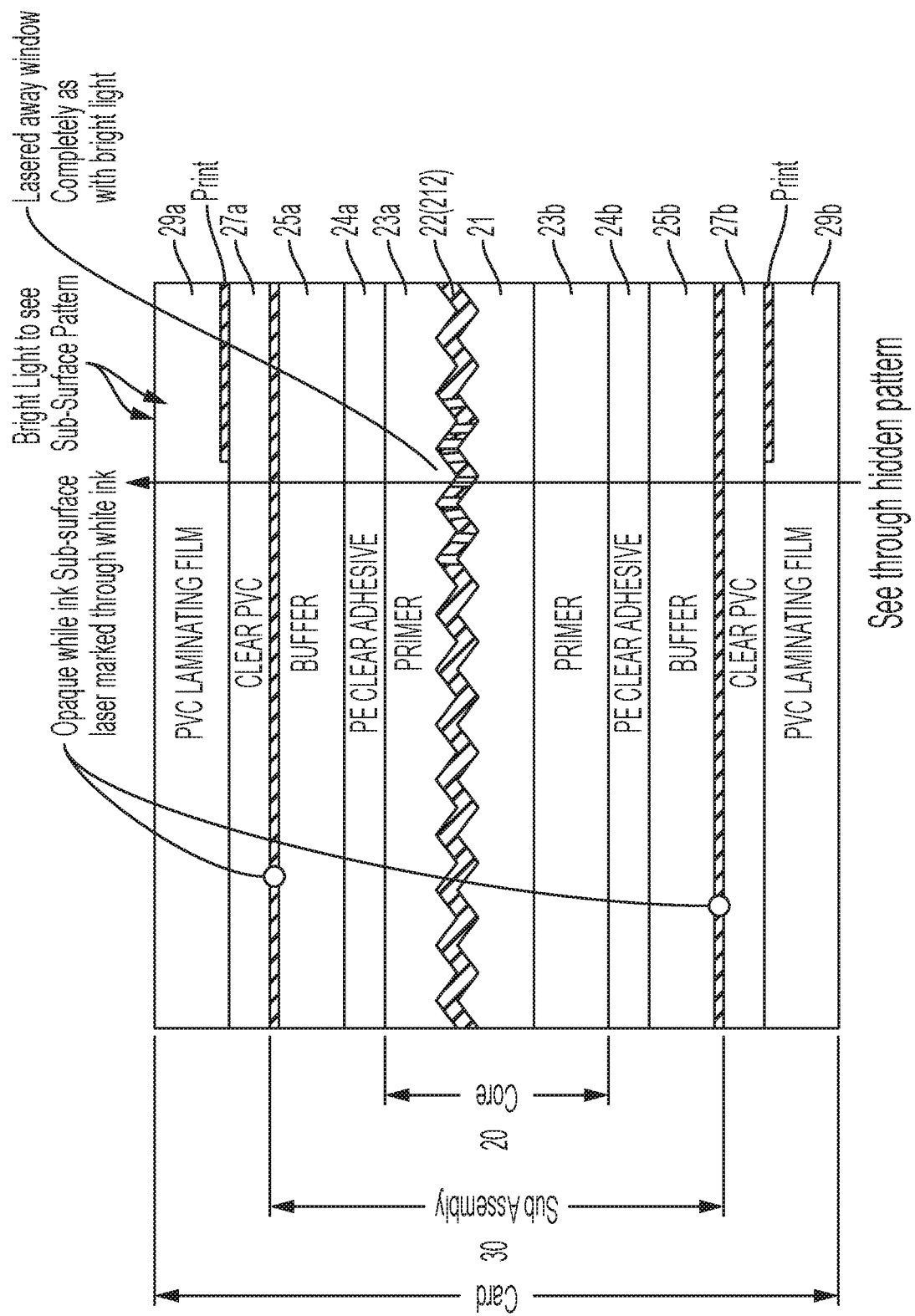
FIG. 12 is a cross sectional diagram of still another card with a lasered window embodying the invention.

FIG. 12 illustrates that a window or opening can be formed by lasering through the metal layer within core layer 20 to provide a "see-through" condition. That is, lasering through the metal layer forms a window which provides visibility through both sides (top and bottom) of the card. This may be viewed by applying a light source such as a flashlight in direct contact with one side of the card and viewing the light pattern on the other side.

TABLE 1

Example of Steps and materials in forming core, sub assembly and card

| step | I | II | III | IV |
|---|---|---|---|---|
| 1 | Start with base/central layer 21 of PET/OPET material | Start with base/central layer 21/210 of PET/OPET material | Start with base/central layer 21 of PET/OPET material | Start with base/central layer 21/210 of PET/OPET material |
| 1A | | Deposit embossing layer 200 on one surface of layer 21/210 | | Deposit embossing layer 200 on one surface of layer 21/210 |
| 2 | Emboss one surface of base layer 231 with pattern | Emboss top surface of embossing layer 200 with pattern 200a | Emboss one surface of base layer 21 with pattern | Emboss top surface of embossing layer 200 with pattern 200a |
| 3 | Vapor deposition of metal 22 on pattern | Vapor deposition of metal 22 on pattern | Vapor deposition of HRI coating 212 on pattern | Vapor deposition of HRI coating 212 on pattern |
| 4 | Apply clear primer coats 23a, 23b to top and bottom Thickness: .00002-.0002 | Apply clear primer coats 23a, 23b to top and bottom Thickness: .00002-.0002 | Apply clear primer coats 23a, 23b to top and bottom Thickness: .00002-.0002 | Apply primer clear coats 23a, 23b to top and bottom Where primer coat 23a, 23b Thickness: .00002-.0002 |
| 5 | Form clear PE adhesive layers 24a, 24b - fairly thick, sticky Thickness: .0005-.005 | Form clear PE adhesive layers 24a, 24b fairly thick, sticky Thickness: .0005-.005 | Form clear PE adhesive layers 24a, 24b fairly thick, sticky Thickness: .0005-*.005 | Form clear PE adhesive layers 24a, 24b fairly thick, sticky Thickness: .0005-.005 |
| 6 | Form clear buffer layer 25a, 25b of PVC material thickness .0008-.005 | Form clear buffer layer 25a, 25b of PVC material thickness .0008-.005 | Form clear buffer layer 25a, 25b of PVC material thickness .008-.005 | Form clear buffer layer 25a, 25b of PVC material thickness .008-.005 |
| 7 | Form clear white PVC layer white PVC layer 27a, 27b Thickness .004 to .012 | Form clear white PVC layer 27a, 27b Thickness .004 to .012 | Form clear white PVC layer 27a, 27b Thickness .004 to .012 | Form clear white PVC layer 27a, 27b Thickness .004 to .012 |
| 8 | Form PVC laminating film 29a, 29b Thickness .0008 to .005 | Form PVC laminating film 29a, 29b Thickness .0008 to .005 | Form PVC laminating film 29a, 29b Thickness .0008 to .005 | Form PVC laminating film 29a, 29b Thickness .0008 to .005 |

All dimensions in inches

What is claimed:

1. A method for making a card comprising the steps of: stacking a plurality of plastic layers with one layer of said plurality of plastic layers including an integrated circuit (IC) containing electronic circuitry and an antenna connected to the IC for enabling contactless radio frequency (RF) communication;
forming a metallic layer overlying and attached to said plurality of plastic layers, wherein the metallic layer is formed by embossing a pattern on a plastic layer selected from said plurality of plastic layers and depositing the metallic layer on the pattern embossed on said selected plastic layer to form an embossed metallic layer; and
forming at least one window within the embossed pattern, wherein the embossed metallic layer acts as a radio frequency shield surrounding the at least one window.

2. The method as claimed in claim 1 wherein the step of forming at least one window includes lasering a selected area of the metallic layer to form said at least one window.

3. The method as claimed in claim 1 wherein the metallic layer is formed by vapor deposition to form a thin layer; and further including the step of lasering the metallic layer to personalize the card.

4. The method as claimed in claim 1, wherein the step of forming at least one window includes applying a laser to the metallic layer for selectively ablating selected portions of the metallic layer.

5. The method as claimed in claim 1, further comprising attaching a first clear primer layer to the embossed metallic layer and attaching a second clear primer layer to the bottom surface of the plurality of plastic layers.

6. The method as claimed in claim 5, wherein the first clear primer layer, the embossed metallic layer, the plurality of plastic layers, and the second clear primer layer together define a central core region of the card.

7. The method as claimed in claim 5, further comprising attaching a first buffer layer to the first clear primer layer and attaching a second buffer layer between the second clear primer layer and a carrier layer, each of said first and second buffer layers having first materials of construction.

8. The method as claimed in claim 7, wherein the carrier layer is a plastic layer.

9. The method as claimed in claim 8, wherein the first and second clear primer layers are protective layers for protecting the embossed metallic layer, each comprising a first adhesive and second materials of construction.

10. The method as claimed in claim 7, further comprising attaching first and second additional plastic layers, the first additional plastic layer being attached to the first buffer layer and the second additional plastic layer being attached to the carrier layer, and printing graphic material on selected ones of said carrier layer, said plurality of plastic layers, or said first or second additional plastic layers.

11. The method as claimed in claim 1, wherein the metallic layer is opaque.

12. A method for forming a card comprising the steps of:
forming a metal layer on and overlying a base plastic layer, wherein the metal layer is formed by embossing a pattern on the base plastic layer and depositing the metal layer on the pattern embossed on the base plastic layer to form an embossed metal layer;
attaching a first number of (clear) plastic layers, overlying the metal layer, to the metal layer;
attaching a second number of (clear) plastic layers, underlying the base plastic layer, to the base plastic layer;
said second number of plastic layers including an integrated circuit (IC) containing selected electronic circuits and an antenna connected to said IC for enabling contactless radio frequency communication with an external device; and
selectively modifying the metal layer to customize the card, the selective modifying comprising forming at least one window within the embossed pattern, wherein the embossed metal layer acts as a radio frequency shield surrounding the at least one window.

13. The method as claimed in claim 12, wherein the metallic layer is opaque.

14. The method for forming a card as claimed in claim 12, wherein the step of selectively modifying the metal layer includes using a laser to ablate selected portions of the metal layer.

15. The method for forming a card as claimed in claim 14, wherein the step of attaching the first number of plastic layers includes attaching a first clear plastic buffer layer to and overlying the metal layer via a clear adhesive primer layer; and wherein the step of attaching the second number of plastic layers includes attaching a clear plastic buffer layer to and underlying the base plastic layer.

* * * * *